(12) United States Patent
Borthakur (10) Patent No.: US 7,767,544 B2
(45) Date of Patent: Aug. 3, 2010

(54) SEMICONDUCTOR FABRICATION METHOD AND SYSTEM

(75) Inventor: Swarnal Borthakur, Boise, ID (US)

(73) Assignee: Micron Technology Inc., Boise, ID (US)

( * ) Notice: Subject to any disclaimer, the term of this patent is extended or adjusted under 35 U.S.C. 154(b) by 409 days.

(21) Appl. No.: 11/786,609

(22) Filed: Apr. 12, 2007

(65) Prior Publication Data

US 2008/0251871 A1    Oct. 16, 2008

(51) Int. Cl.
*H01L 21/30* (2006.01)
*H01L 21/46* (2006.01)
*H01L 21/50* (2006.01)
*H01L 21/48* (2006.01)
*H01L 21/44* (2006.01)

(52) U.S. Cl. .................... 438/456; 438/455; 438/106

(58) Field of Classification Search ............ 438/455, 438/456, 106
See application file for complete search history.

(56) References Cited

U.S. PATENT DOCUMENTS

| | | | |
|---|---|---|---|
| 6,703,689 B2 * | 3/2004 | Wada | 257/621 |
| 7,180,149 B2 * | 2/2007 | Yamamoto et al. | 257/434 |
| 7,288,757 B2 * | 10/2007 | Farnworth et al. | 250/239 |
| 7,419,852 B2 * | 9/2008 | Benson et al. | 438/108 |
| 7,452,743 B2 * | 11/2008 | Oliver et al. | 438/57 |
| 7,531,443 B2 * | 5/2009 | Pratt | 438/618 |
| 2008/0308934 A1 * | 12/2008 | Alvarado et al. | 257/738 |
| 2009/0014869 A1 * | 1/2009 | Vrtis et al. | 257/737 |

\* cited by examiner

*Primary Examiner*—Luan C Thai
(74) *Attorney, Agent, or Firm*—Fletcher Yoder P.C.

(57) ABSTRACT

Embodiments of the present invention are generally directed to a method for manufacturing a semiconductor device. In one embodiment, the method includes providing a substrate that includes a via or interconnect. In this embodiment, the method also includes forming a sealed array, in which forming such an array includes attaching a carrier to a first surface of the substrate to form a sealed cavity between the carrier and the substrate. Further, the method of this embodiment also includes forming a redistribution layer on the sealed array over a second surface of the substrate. Devices and systems having a carrier attached to a substrate are also disclosed.

26 Claims, 4 Drawing Sheets

SEMICONDUCTOR FABRICATION METHOD AND SYSTEM

BACKGROUND

1. Field of the Invention

Embodiments of the present invention relate generally to the field of semiconductor devices. More particularly, embodiments of the present invention relate to the production of semiconductor devices, such as image sensing devices, having a carrier disposed over a substrate to form a sealed cavity.

2. Description of the Related Art

Microprocessor-controlled circuits are used in a wide variety of applications. Such applications include personal computers, cellular phones, digital cameras, control systems, and a host of other consumer products. A personal computer, digital camera, or the like, generally includes various components, such as microprocessors, that handle different functions for the system. By combining these components, various consumer products and systems may be designed to meet specific needs. Microprocessors are essentially generic devices that perform specific functions under the control of software programs. These software programs are generally stored in one or more memory devices that are coupled to the microprocessor and/or other peripherals.

Electronic components such as microprocessors and memory devices often include numerous integrated circuits manufactured on a semiconductor substrate. The various structures or features of these integrated circuits may be fabricated on a substrate through a variety of manufacturing processes known in the art, including layering, doping, and patterning. Obviously, the size of each feature directly impacts the number of features that may be formed on a substrate of a given size. Accordingly, it is generally desirable to reduce the size of such features in order to increase the number of elements that may be formed in a given area of the substrate.

In addition to microprocessors and/or memory devices, some systems, such as digital cameras, generally include an image sensor (e.g., a charge coupled device (CCD) sensor or a complementary metal oxide semiconductor (CMOS) sensor) configured to receive an image. Typically, such image sensors include an array of sensor pixel cells or photoreceptors that utilize the photoelectric effect to convert incident photons (i.e., those photons striking the photoreceptors of the sensor) into electrical charges. Once these photons are converted into electrical charges, a microprocessor may process the electrical charges into digital data that may be stored and/or used to reconstruct the captured image.

SUMMARY

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

Embodiments of the present invention generally relate to a technique for the efficient fabrication of a semiconductor device, such as an imager, and to devices and systems including such semiconductor devices. In some embodiments, a carrier is coupled to a substrate to form a sealed cavity therebetween. For example, the carrier may be adhered to the substrate via an epoxy or glue, or coupled in some other fashion. Additionally, in certain embodiments, the substrate may comprise an image sensor configured to receive light through the carrier and to convert the light into data.

Further, in some embodiments, a redistribution layer is formed on the substrate to facilitate electrical communication between components of the substrate and other external circuitry. The redistribution layer may include some combination of passivation and conductive layers to facilitate routing of electrical signals from the substrate components, such as an image sensor, to external circuitry. Also, under-bump-metallurgy features, such as plating layers and contact bumps, may be formed on or coupled to the redistribution layer to further facilitate such communication, and to permit efficient mounting of the substrate to some other component, such as a circuit board.

Still further, in some embodiments, the carrier is attached to the substrate and the redistribution layer is formed without using any vacuum processes. For instance, in one embodiment, the carrier is adhered to the substrate in a processing environment having a pressure between 0.5 atm and 0.9 atm. In such an embodiment, the redistribution layer may be advantageously formed through a variety of non-vacuum pressure processes, such as spinning-on passivation layers of the redistribution layer at or near atmospheric pressure, and forming a conductive layer through atmospheric pressure chemical vapor deposition.

Various refinements of the features noted above may exist in relation to various aspects of the present invention. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of the present invention without limitation to the claimed subject matter.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components.

Figure 1:
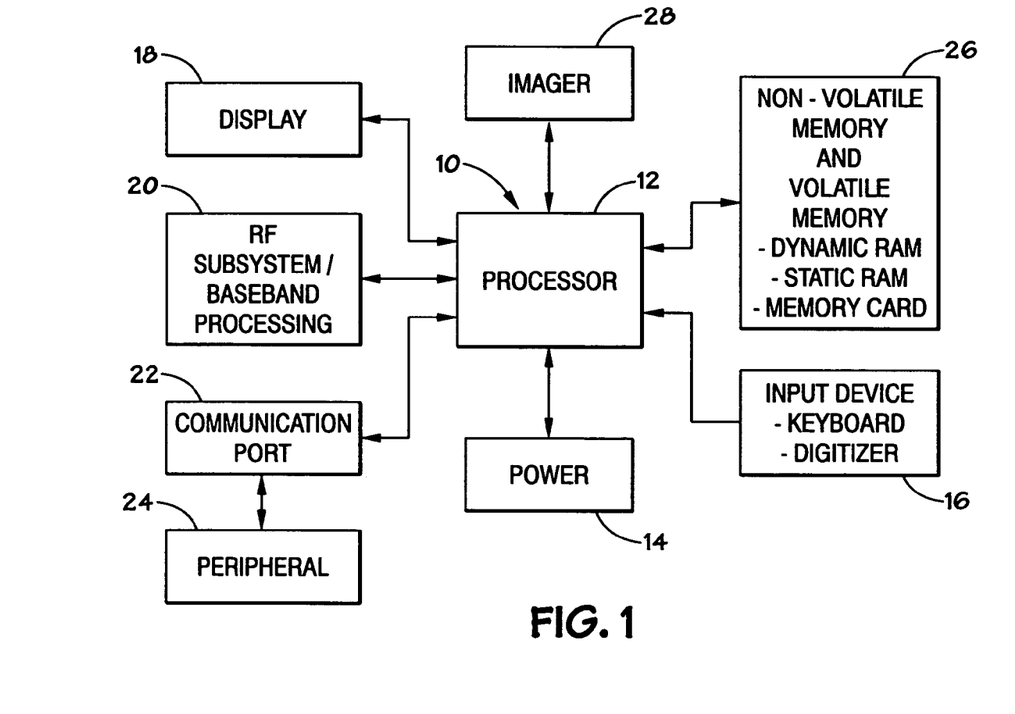
FIG. 1 illustrates a block diagram of a processor-based device in accordance with one embodiment of the present invention.

Turning now to the drawings, FIG. 1 is a block diagram of an electronic system containing integrated circuit devices that may employ embodiments of the present invention. The electronic device or system, which is generally referred to by the reference numeral 10, may be any of a variety of types such as a computer, digital camera, cellular phone, personal organizer, or the like. In a typical processor-based device, a processor 12, such as a microprocessor, controls the operation of system functions and requests.

The system 10 may include a power supply 14, which may comprise a battery or batteries, an AC power adapter, or a DC power adapter, for instance. Various other devices may be coupled to the processor 12 depending on the functions that the system 10 performs. For example, an input device 16 may be coupled to the processor 12 to receive input from a user. The input device 16 may comprise a user interface and may include buttons, switches, a keyboard, a light pen, a mouse, a digitizer, a voice recognition system, or any of a number of other input devices. An audio or video display 18 may also be coupled to the processor 12 to provide information to the user. The display 18 may include an LCD display, a CRT display, LEDs, or an audio display, for example.

An RF sub-system/baseband processor 20 may be coupled to the processor 12 to provide wireless communication capability. The RF subsystem/baseband processor 20 may include an antenna that is coupled to an RF receiver and to an RF transmitter (not shown). Furthermore, a communications port 22 may be adapted to provide a communication interface between the electronic system 10 and a peripheral device 24. The peripheral device 24 may include a docking station, expansion bay, or other external component.

The processor 12 may be coupled to various types of memory devices to facilitate its operation. For example, the processor 12 may be connected to memory 26, which may include volatile memory, non-volatile memory, or both. The volatile memory of memory 26 may comprise a variety of memory types, such as static random access memory ("SRAM"), dynamic random access memory ("DRAM"), first, second, or third generation Double Data Rate memory ("DDR1", "DDR2", or "DDR3", respectively), or the like. The non-volatile memory of the memory 26 may comprise various types of memory such as electrically programmable read only memory ("EPROM") or flash memory, for example. Additionally, the non-volatile memory may include a high-capacity memory such as a tape or disk drive memory.

The system 10 may also include an image sensor or imager 28 coupled to the processor 12 to provide digital imaging functionality. The imager 28 may include a charge coupled device (CCD) sensor or a complementary metal oxide semiconductor (CMOS) sensor having an array of photoreceptors or pixel cells configured to be impacted by photons and to convert such impact into electrical current via the photoelectric effect. While the imager 28 may be coupled remotely from the processor 12, such as by way of a circuit board, the imager 28 and processor 12 may instead be integrally formed, such as on a common substrate.

Figure 2:
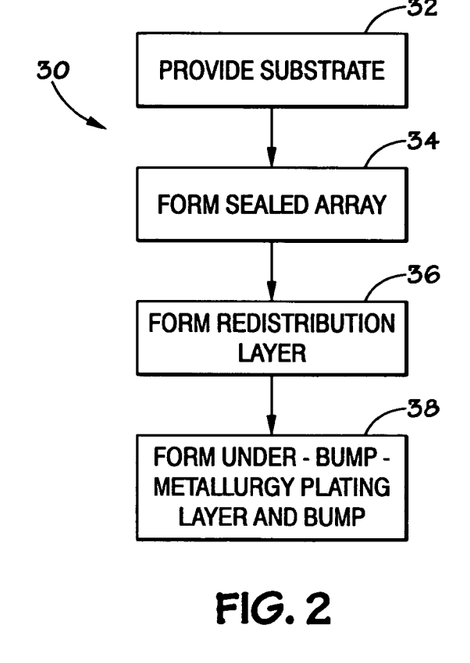
FIG. 2 is a flow diagram of a method related to the manufacture of a device in accordance with one embodiment of the present invention.

A method 30 for manufacturing a semiconductor device, such as the processor 12 and/or the imager 28, is generally provided in FIG. 2 in accordance with one embodiment of the present invention. Particularly, the method 30 includes a number of steps 32-38, which are described in greater detail below with respect to FIGS. 3-9. For instance, the method 30 includes a step 32 of providing a substrate and a step 34 of forming a sealed array, as generally discussed herein with respect to FIGS. 3 and 4. Further, the method 30 also includes a step 36 of forming a redistribution layer, as is generally discussed below in reference to FIGS. 5-8. Additionally, the method 30 includes a step 38 of forming one or more under-bump-metallurgy features, such as a plating layer, contact bumps, or the like, as discussed with respect to FIG. 9. As will be appreciated, one or more of these steps may be performed in a reactor or processing chamber such that the environment in which the steps are performed may be regulated.

Figure 3:
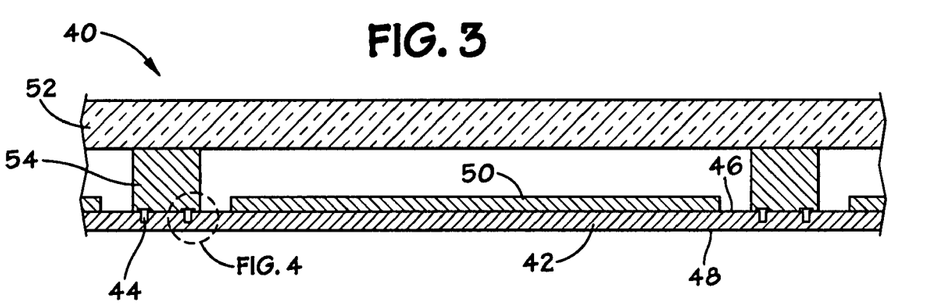
FIG. 3 is a cross-sectional view of a device having, among other things, a via disposed in a substrate and a carrier adhered to the substrate in accordance with one embodiment of the present invention.
Figure 4:
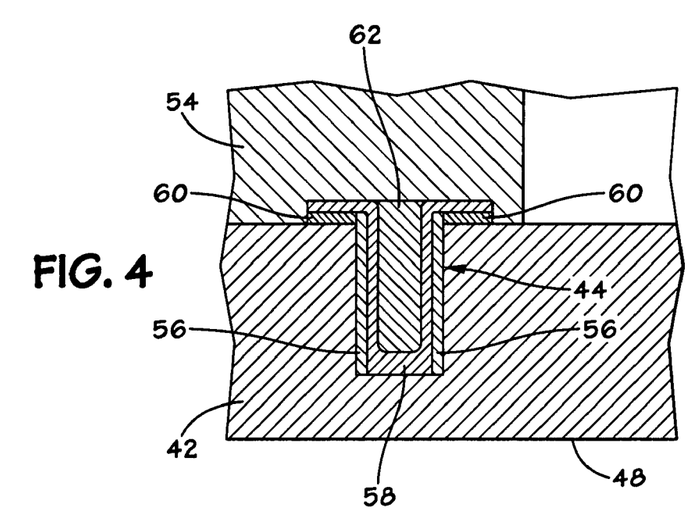
FIG. 4 is a cross-sectional view of a portion of the device of FIG. 3, depicting in greater detail the substrate and via of the device in accordance with one embodiment of the present invention.

Discussing first the steps 32 and 34, a sealed array or device 40, such as a sealed imager array, is illustrated in FIGS. 3 and 4 in accordance with one embodiment of the present invention. The device 40 includes a substrate 42 having one or more through-wafer interconnects (TWI) or vias 44. For the sake of efficiency, the present technique may be implemented as a wafer-level process, in which the substrate 42 is a semiconductor wafer having numerous die regions having various features formed thereon, such as an image sensor, thus facilitating simultaneous mass production of such devices 40. In other embodiments, however, the substrate 42 may be composed of other structures, such as an individual semiconductor die, in accordance with the present technique.

In the presently illustrated embodiment, the vias 44 are formed in an upper surface 46 of the substrate 42, although similar vias could be formed instead on a lower surface 48 of the substrate 42 in other embodiments. It should be noted that, in certain embodiments, the vias 44 may be formed in the upper surface 46 prior to the attachment of a carrier 52 to the substrate, as discussed below, and/or the vias 44 may be formed in the lower surface 48 before or after the attachment of the carrier 52. Additionally, in an embodiment in which the substrate 42 includes an image sensor, the substrate 42 may also include a layer 50 of microlenses that serve to focus incoming light on the photoreceptors of the image sensor, as depicted in FIG. 3.

The carrier 52 is coupled to the substrate 42 to form the sealed array or device 40. In some embodiments, such as that presently illustrated, the carrier 52 is generally positioned parallel to, and in spaced relation with, the substrate 42 to form an interior region or sealed cavity between these two elements. In one embodiment, the carrier 52 is adhered to the upper surface 46 of the substrate 42 via an adhesive 54, such as an epoxy, glue, or the like. In various embodiments, the carrier 52 may comprise one or more of glass, silicon, or some other suitable material that allows light to pass through the carrier 52 and impact an image sensor of the substrate 42 disposed within the sealed cavity, such as the imager 28.

Additionally, in some embodiments, the carrier 52 is coupled to the substrate 42 at pressure rather than in a vacuum, such that the sealed cavity is pressurized. For instance, in one embodiment, the carrier 52 is coupled to a substrate 42 within a processing chamber at a pressure less than or equal to 1 atm, such as between 0.5 and 0.9 atm. In such an embodiment, the pressure within the cavity will match that within the processing chamber when the device 40 is at a temperature identical to that of the processing chamber during coupling of the carrier 52 to the substrate 42. Further, the pressure may be chosen such that the pressure within the cavity of device 40 reaches 1 atm at a desired temperature, such as 40° C., 45° C., or 50° C., for instance, to generally maintain a positive pressure differential between an exterior pressure and the pressure within the cavity and reduce the likelihood of damage to the substrate 42 or other components of the device 40 resulting from excess pressure within the cavity.

As illustrated in FIG. 4, a via 44 may include a dielectric material 56 that at least partially isolates a conductive material 58 from other portions of the substrate 42. The dielectric material 56 may be formed through a pulsed deposition layer process, or through any other suitable process. Further, in some embodiments, the conductive material 58 comprises a metal, such as palladium, a copper-nickel alloy, or the like. The conductive material 58 is disposed in contact with contact pads 60 to facilitate electrical communication between the conductive material 58 and other features of the substrate 42, such as an image sensor. Additionally, in one embodiment, the remainder of the via 44 comprises a fill material 62, such as polymer and/or solder.

Figure 5:
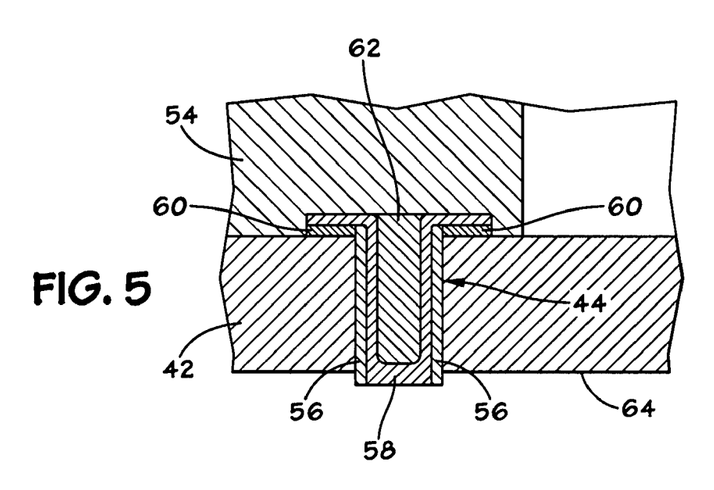
FIG. 5 is a cross-sectional view of the device of FIG. 4 following the thinning of the substrate in accordance with one embodiment of the present invention.

Turning now to the step 36 of the method 30 (FIG. 2), the formation of the redistribution layer on the substrate 42 may be better understood with reference to FIGS. 5-8. Particularly, the lower surface 48 of the device 40 may be ground and/or polished such that the vias 44 are exposed along a lower surface 64 of the substrate 42, as generally illustrated in FIG. 5. In one embodiment including a silicon substrate 42, NH4OH is used to selectively etch the silicon to expose the vias 44. As may be appreciated, however, other materials and/or processes may also or instead be used to thin the substrate 42 and/or expose the vias 44.

Figure 6:
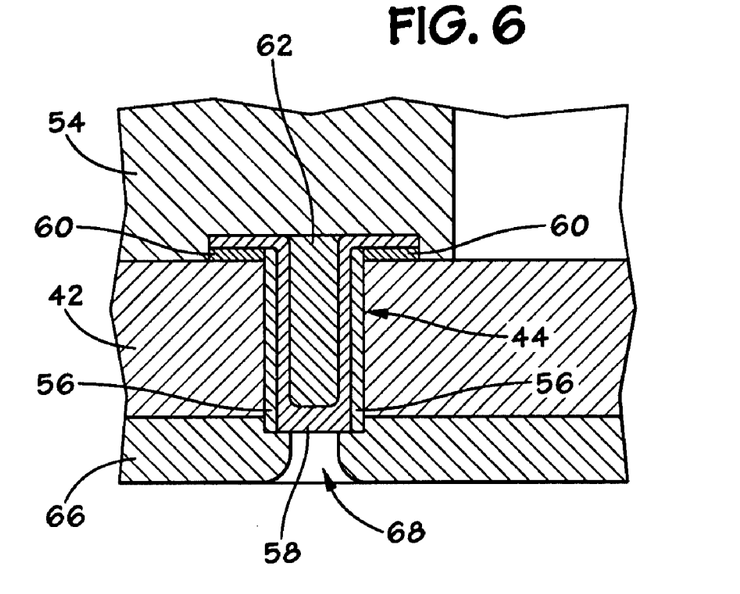
FIG. 6 is cross-sectional view of the device of FIG. 5, illustrating the addition of a passivation layer to the substrate in accordance with one embodiment of the present invention.

A passivation layer 66 may be added to the substrate 42, as generally illustrated in FIG. 6. The passivation layer 66 includes a window 68 that exposes an associated via 44. As will be appreciated, although not shown in the present, detailed view, the passivation layer 66 may include a number of such windows 68 to expose a plurality of vias 44. The passivation layer 66 and the window 68 may be formed through any suitable process. For instance, in one embodiment, the passivation layer 66 is spun-on to the substrate 42 and patterned to form the window 68. Further, in one embodiment, patterning the window 68 may include applying a photoresist layer to the passivation layer 66, exposing and developing the photoresist layer, etching the window 68 through the opening in the photoresist layer, stripping the photoresist layer, or the like.

Figure 7:
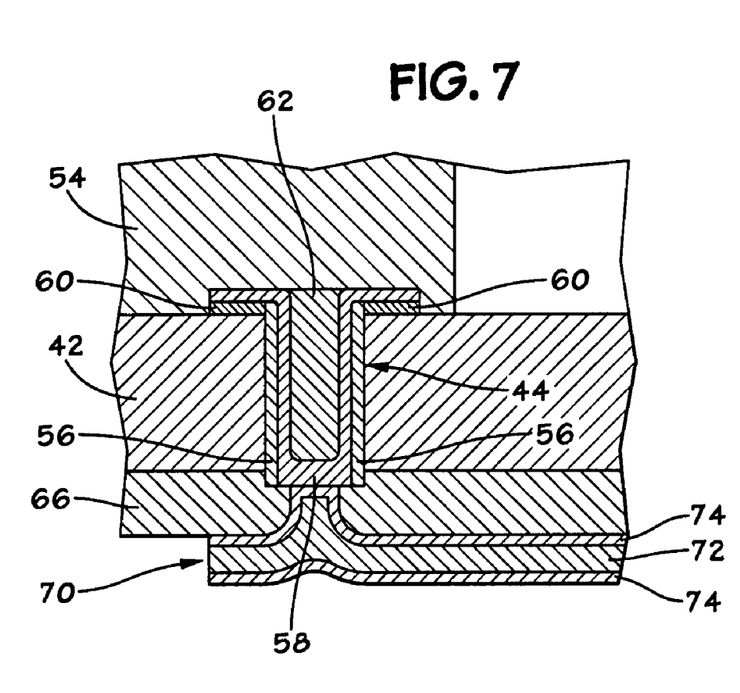
FIG. 7 is a cross-sectional view generally illustrating the addition of one or more metal layers to the device of FIG. 6 in accordance with one embodiment of the present invention.

In one embodiment, a conductive layer 70 is then applied over the passivation layer 66 and in contact with the via 44, as generally depicted in FIG. 7. In the presently illustrated embodiment, the conductive layer 70 includes an aluminum sub-layer 72, which is disposed between a pair of titanium sub-layers 74. It should be noted that, in other embodiments, the conductive layer 70 may be composed of different materials and/or a different number of layers or sub-layers other than those described immediately above, and may even be composed of a single layer of conductive material instead of a plurality of sub-layers. For instance, in other embodiments, the conductive layer 70 may comprise one or more layers of copper, tantalum-nitride, or the like. Notably, in some embodiments, the conductive layer 70 is formed through an atmospheric pressure chemical vapor deposition (APCVD) process, as discussed in greater detail below.

Also, the conductive layer 70 may be patterned through various steps, such as resist and etch steps, to produce a desired configuration. For instance, in some embodiments, a photoresist layer may be disposed over the conductive layer 70 and developed to expose certain portions of the conductive layer 70, which may then be removed via wet and/or dry etch processes. In one embodiment, the exposed portions of the conductive metal layer 70 may be etched through a wet etch process that utilizes $HNO_3$, HF, and $H_2O$.

Figure 8:
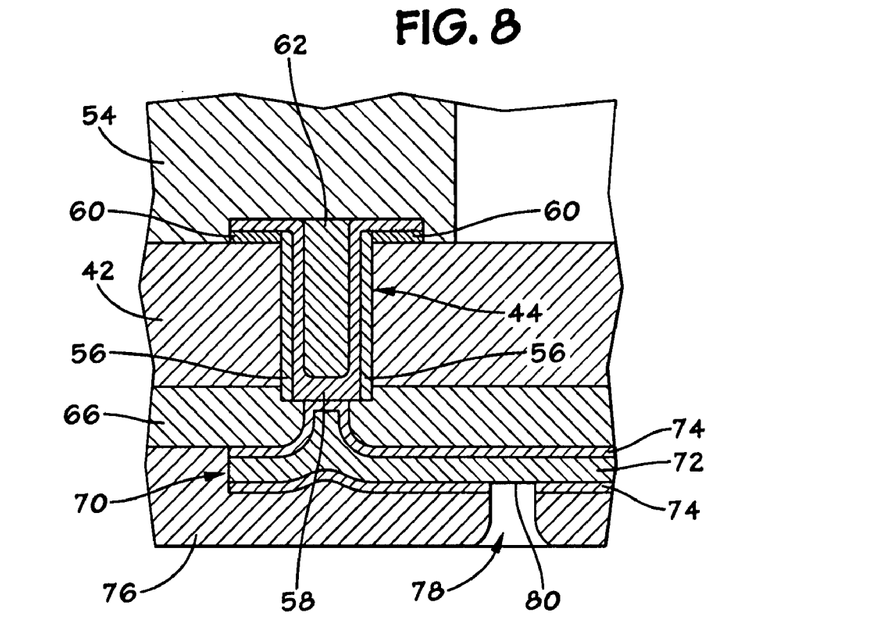
FIG. 8 is a cross-sectional view depicting an additional passivation layer formed on the device of FIG. 7 in accordance with one embodiment of the present invention.

Following any desired patterning of the conductive layer 70, a passivation layer 76 may be generally disposed over a conductive layer 70, as provided in FIG. 8. The passivation layer 76 includes a window 78 that exposes a surface 80 of the conductive layer 70. Further, the passivation layer 76 and window 78 may be formed through any suitable processes, including those discussed above with respect to the passivation layer 66.

Thus, the redistribution layer formed through step 36 of the method 30 generally includes the conductive layer 70 and the passivation layers 66 and 76. While the redistribution layer of some embodiments may include additional elements or layers, the redistribution layer of other embodiments consist of, or consist essentially of, the conductive layer 70 and the passivation layers 66 and 76. Additionally, it should be noted that, in some embodiments, the redistribution layer is formed without relying on any vacuum processes, and is formed entirely through fabrication processes at pressure, which may reduce the incidence of damage to the substrate 42 and/or the carrier 52 from an excessive pressure differential between the sealed cavity of the device 40 and the one or more processing chambers in which the device 40 is disposed for formation of the redistribution layer. For instance, the passivation layers 66 and 76 may be formed through low pressure and/or atmospheric pressure processes, while the conductive layer 70 may be formed through one or more APCVD processes or low pressure chemical vapor deposition (LPCVD) processes. In one embodiment, for example, the various layers of the redistribution layer are formed in one or more processing chambers in an environment having pressure substantially equal to 1 atm.

Figure 9:
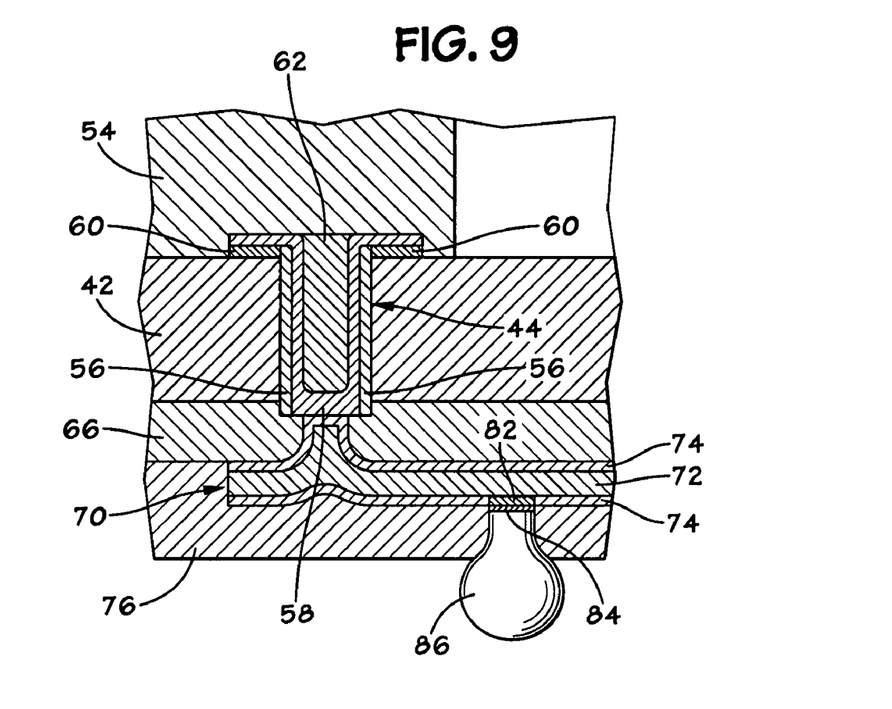
FIG. 9 is a partial cross-sectional view depicting the formation of under-bump-metallurgy (UBM) features on the device of FIG. 8 in accordance with one embodiment of the present invention.

Finally, with respect to step 38 of the method 30, various UBM features may be formed on the device 40, as generally illustrated in FIG. 9. In the presently illustrated embodiment, a portion of the outer titanium sub-layer 74 is etched to expose the aluminum layer 72 and the surface 80 in preparation for such features. In some embodiments, the titanium layer 74 may be etched via wet etch process, which may also serve to descum a surface 80 to facilitate formation of various UBM features.

Particularly, the exposed surface 80 of the conductive layer 70 may be plated with one or more materials, as generally represented by plating layers 82 and 84, before receiving a contact bump 86. In one embodiment, the plating layer 82 comprises nickel and may be formed through an electroless deposition process, while the plating layer 84 comprises gold that is formed through an immersion plating process. In other embodiments, however, one or both of the plating layers 82 and 84 may be formed through different processes, may be formed of different materials, or may be omitted entirely. Additionally, in one embodiment, the surface 80 undergoes a preparation process, such as zincating, to facilitate adhesion of the plating layer 82 to the surface 80.

Following any desired plating, a contact bump 86 may be coupled to the surface 80, either directly or via the one or more plating layers. The contact bump 86 may be formed of any suitable, electrically-conductive material, such as solder. Notably, the contact bump 86 facilitates direct coupling of the device 40 to other circuitry. In some embodiments, the provision of contact bumps 86 may allow for the direct coupling of the substrate 42 to a circuit board without requiring additional, intervening substrates or wire bonding. For instance, in one embodiment, contact bump 86 may enable the device 40 to be directly received in a socket of a circuit board, allowing electrical communication between features of the substrate 42, such as an image sensor or imager 28, and various circuitry external to the device 40.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method comprising:
   providing a substrate;
   forming a via in the substrate;
   forming a sealed array, wherein forming the sealed array comprises attaching a carrier to a first surface of the substrate such that a sealed cavity is formed between the substrate and the carrier; and
   forming a redistribution layer on the sealed array over a second surface of the Substrate;
   wherein the forming of the sealed array and the forming of the redistribution layer are performed in one or more reactor chambers at pressures greater than 0.5 atm.

2. The method of claim 1, wherein the substrate comprises a semiconductor wafer.

3. The method of claim 1, wherein the substrate comprises an image sensor.

4. The method of claim 3, wherein the substrate comprises a layer of microlenses.

5. The method of claim 3, wherein forming the sealed array comprises attaching the carrier to the first surface of the substrate such that the image sensor is disposed within the sealed cavity.

6. The method of claim 1, wherein forming the redistribution layer comprises:
   forming a passivation layer on the second surface of the substrate;
   forming a metal layer on the passivation layer and in electrical communication with the via; and
   forming an additional passivation layer on the metal layer.

7. The method of claim 6, wherein the metal layer comprises multiple sub-layers.

8. The method of claim 7, wherein the metal layer comprises a first sub-layer including titanium disposed on the passivation layer, a second sub-layer including aluminum disposed on the first sub-layer, and a third sub-layer including titanium disposed on the second sub-layer.

9. The method of claim 6, wherein forming the redistribution layer comprises deposition and patterning of the passivation layer, the metal layer, and/or the additional passivation layer.

10. The method of claim 6, wherein the metal layer is formed through an atmospheric pressure chemical vapor deposition process.

11. The method of claim 1, comprising forming under-bump-metallurgy (UBM) features on the redistribution layer.

12. The method of claim 11, wherein forming UBM features comprises plating an exposed metallic surface of the redistribution layer and/or forming a metallic bump on the exposed metallic surface.

13. The method of claim 1, wherein the sealed array is formed at a lower pressure than the redistribution layer, such that the pressure within the sealed cavity is less than that of a reactor chamber in which the sealed array is disposed during formation of the redistribution layer.

14. The method of claim 1, wherein the redistribution layer comprises a plurality of layers formed in one or more processing chambers at a pressure substantially equal to 1 atm.

15. The method of claim 1, wherein attaching the carrier to the first surface is performed at a pressure less than or substantially equal to 0.9 atm.

16. The method of claim 1, wherein the second surface is opposite the first surface.

17. The method of claim 1, wherein attaching the carrier to the first surface comprises coupling the carrier to the first surface via an adhesive.

18. A method comprising:
   providing a semiconductor substrate,
   coupling, at pressure, a carrier to a first surface of the semiconductor substrate in spaced relation thereto to form a device including a pressurized sealed cavity between the semiconductor substrate and the carrier; and
   processing the device including the pressurized sealed cavity to form a redistribution layer on a second surface of the semiconductor substrate, wherein processing the device to form the redistribution layer includes:
      forming, at pressure, a conductive layer in electrical communication with a through-wafer interconnect of the semiconductor substrate, wherein forming the conductive layer includes forming the conductive layer via atmospheric pressure chemical vapor deposition;
      patterning the conductive layer; and
      forming a passivation layer over the patterned conductive layer.

19. The method of claim 18, comprising removing material from the device including the pressurized sealed cavity at the second surface of the semiconductor substrate to expose the through-wafer interconnect prior to processing the device to form the redistribution layer.

20. The method of claim 18, comprising forming the through-wafer interconnect of the semiconductor substrate.

21. The method of claim 20, wherein forming the through-wafer interconnect includes forming the through-wafer interconnect prior to coupling of the carrier to the first surface of the semiconductor substrate.

22. The method of claim 18, wherein each portion of the redistribution layer is formed at pressure.

23. The method of claim 18, wherein patterning the conductive layer includes patterning the conductive layer with a liquid etchant.

24. A method comprising:
providing a semiconductor substrate including an image sensor,
coupling, at pressure, an optically-transparent carrier to a first surface of the semiconductor substrate in spaced relation thereto to form a device including a pressurized sealed cavity between the semiconductor substrate and the carrier, wherein the image sensor is positioned within the pressurized sealed cavity and the device is configured to enable light to pass through the carrier and impinge upon the image sensor; and
processing the device including the pressurized sealed cavity to form a redistribution layer on a second surface of the semiconductor substrate, wherein processing the device to form the redistribution layer includes forming the redistribution layer via atmospheric pressure chemical vapor deposition.

25. The method of claim 24, wherein providing the semiconductor substrate comprises providing a semiconductor wafer including a plurality of semiconductor dies each including a respective image sensor.

26. The method of claim 1, wherein forming the via in the substrate includes forming the via prior to forming the sealed array.

* * * * *

UNITED STATES PATENT AND TRADEMARK OFFICE
CERTIFICATE OF CORRECTION

PATENT NO. : 7,767,544 B2  Page 1 of 1
APPLICATION NO. : 11/786609
DATED : August 3, 2010
INVENTOR(S) : Swarnal Borthakur It is certified that error appears in the above-identified patent and that said Letters Patent is hereby corrected as shown below:

In column 7, line 42, in Claim 1, delete "Substrate;" and insert -- substrate; --, therefor.

Signed and Sealed this

Nineteenth Day of October, 2010

David J. Kappos
*Director of the United States Patent and Trademark Office*